United States Patent
Nettesheim et al.

(10) Patent No.: US 10,904,995 B2
(45) Date of Patent: Jan. 26, 2021

(54) PLASMA GENERATOR

(71) Applicants: TDK Electronics AG, Munich (DE); relyon plasma GmbH, Regensburg (DE)

(72) Inventors: Stefan Nettesheim, Regensburg (DE); Dominik Burger, Alteglofsheim (DE); Florian Hoppenthaler, Regensburg (DE); Michael Weilguni, Hagenberg (AT); Markus Puff, Graz (AT); Pavol Kudela, Deutschlandsberg (AT)

(73) Assignees: TDK ELECTRONICS AG, Munich (DE); RELYON PLASMA GMBH, Regensburg (DE)

( * ) Notice: Subject to any disclaimer, the term of this patent is extended or adjusted under 35 U.S.C. 154(b) by 0 days.

(21) Appl. No.: 16/494,261

(22) PCT Filed: Mar. 14, 2018

(86) PCT No.: PCT/EP2018/056418
§ 371 (c)(1),
(2) Date: Sep. 13, 2019

(87) PCT Pub. No.: WO2018/167159
PCT Pub. Date: Sep. 20, 2018

(65) Prior Publication Data
US 2020/0137866 A1    Apr. 30, 2020

(30) Foreign Application Priority Data
Mar. 14, 2017 (DE) .................. 10 2017 105 410

(51) Int. Cl.
*H01L 41/04* (2006.01)
*H05H 1/24* (2006.01)
(Continued)

(52) U.S. Cl.
CPC ......... *H05H 1/2475* (2013.01); *H01L 41/044* (2013.01); *H01L 41/09* (2013.01); *H01L 41/107* (2013.01); *H05H 2001/2481* (2013.01)

(58) Field of Classification Search
CPC .................. H05H 1/24; H05H 1/2475; H05H 2001/2481; H05H 2001/245;
(Continued)

(56) References Cited

U.S. PATENT DOCUMENTS 6,758,199 B2 * 7/2004 Masters .................. F02P 3/12
123/620
9,491,841 B2   11/2016 Jevtic et al.
(Continued)

FOREIGN PATENT DOCUMENTS

DE    202008008733 U1    11/2009
DE    102010011643 A1    9/2011
(Continued)

*Primary Examiner* — Haissa Philogene
(74) *Attorney, Agent, or Firm* — Slater Matsil, LLP

(57) ABSTRACT

A plasma generator is disclosed. In an embodiment a plasma generator includes a piezoelectric transformer subdivided into an input region and an output region in a longitudinal direction, wherein the piezoelectric transformer comprises an output-side end face facing away from the input region, wherein the plasma generator comprises a passive load arranged permanently in front of the output-side end face, and wherein the plasma generator is configured to generate non-thermal atmospheric-pressure plasma.

24 Claims, 3 Drawing Sheets

(51) Int. Cl.
*H01L 41/09* (2006.01)
*H01L 41/107* (2006.01)

(58) Field of Classification Search
CPC ............ H05H 2240/10; H05H 2240/20; H01L 41/044; H01L 41/047; H01L 41/0471; H01L 41/107; H01L 41/18; H01L 41/00
See application file for complete search history.

(56) References Cited

U.S. PATENT DOCUMENTS

| | | | | |
|---|---|---|---|---|
| 9,711,333 | B2* | 7/2017 | Sieber | ............... H01J 37/32449 |
| 9,826,618 | B2* | 11/2017 | Eckert | .................. H05H 1/2406 |
| 10,004,914 | B2* | 6/2018 | Nettesheim | ........... A61L 2/0011 |
| 10,143,510 | B2 | 12/2018 | Nettesheim et al. | |
| 10,506,699 | B2* | 12/2019 | Rinner | ..................... H05H 1/24 |
| 10,531,552 | B2* | 1/2020 | Kudela | ................. H01L 41/044 |
| 10,624,197 | B2* | 4/2020 | Weilguni | .................. C02F 1/30 |
| 10,638,590 | B2 | 4/2020 | Weilguni et al. | |
| 10,772,182 | B2* | 9/2020 | Weilguni | ............. H05H 1/2475 |
| 10,827,599 | B2 | 11/2020 | Doellgast et al. | |
| 2010/0042094 | A1 | 2/2010 | Arts | |
| 2016/0287310 | A1 | 10/2016 | Nettesheim et al. | |
| 2018/0331277 | A1* | 11/2018 | Dollgast | ............... H01L 41/107 |

FOREIGN PATENT DOCUMENTS

| | | |
|---|---|---|
| DE | 102012003563 A1 | 8/2013 |
| DE | 102013109887 A1 | 3/2015 |
| DE | 102014110405 A1 | 1/2016 |
| DE | 102015112410 A1 | 2/2017 |
| JP | H109103885 A | 4/1997 |
| JP | H1022095 A | 1/1998 |
| JP | 2007188690 A | 7/2007 |
| JP | 2016522533 A | 7/2016 |
| JP | 2017508485 A | 3/2017 |
| JP | 2017529687 A | 10/2017 |
| JP | 2018533199 A | 11/2018 |
| WO | 2016012282 A1 | 1/2016 |
| WO | 2017016853 A1 | 2/2017 |

* cited by examiner

PLASMA GENERATOR

This patent application is a national phase filing under section 371 of PCT/EP2018/056418, filed Mar. 14, 2018, which claims the priority of German patent application 102017105410.3, filed Mar. 14, 2017, each of which is incorporated herein by reference in its entirety.

TECHNICAL FIELD

The present invention relates to a plasma generator for generating non-thermal atmospheric-pressure plasma.

SUMMARY OF THE INVENTION

Such a plasma generator can comprise a piezoelectric transformer, in particular, which is a design of a resonance transformer which is based on piezoelectricity and constitutes an electromechanical system, in contrast to the conventional magnetic transformers. The piezoelectric transformer can be a Rosen transformer, in particular.

If a piezoelectric transformer is used for generating a non-thermal atmospheric-pressure plasma, then a high voltage is generated in its output region. If the piezoelectric transformer is operated in a gas as load, then it can happen that occasionally a plasma is ignited at longitudinal edges along the output region. The reason for this is that given the presence of a capacitive load at the output, the maximum potential is not established at the output itself, but rather, depending on load and component geometry, a few millimeters away from the output. The probability of this resulting in ignition along the edges is indeed low, but cannot be entirely ruled out. If repeated ignition occurs at one of the edges, then this ignition generally takes place at the same point as before. Ignition of plasma by the component a few times at said point is sufficient to bring about cracks or, as a further consequence, fractures there.

In order to avoid undesired plasma ignitions at the longitudinal edges of the output region, additional measures are needed. German Patent Application DE 10 2014 110 405 A1 describes, for example, that the output-side longitudinal edges can be rounded or that the output region could be at least partly surrounded by an insulation in order to avoid the undesired plasma ignitions along the edges. The partial insulation of the output region, in particular, damps oscillations of the piezoelectric transformer, with the result that the plasma generation efficiency is reduced. Furthermore, the insulation constitutes a factor that reduces the lifetime of the transformer. Rounding the edges requires additional manufacturing steps that increase the manufacturing outlay.

Embodiments provide a simplified plasma generator in which, for example, such measures for modifying the piezoelectric transformer can be dispensed with.

In various embodiments a plasma generator for generating non-thermal atmospheric-pressure plasma is proposed, which plasma generator comprises a piezoelectric transformer, which is subdivided in the longitudinal direction into an input region and an output region. The piezoelectric transformer comprises an output-side end face facing away from the input region. The plasma generator is configured in such a way that a power sufficient for igniting a non-thermal atmospheric-pressure plasma is applied to the input region of the piezoelectric transformer only if a load is arranged in front of the output-side end face.

The plasma generator comprises a drive electronics unit configured to measure at least one operating parameter of the piezoelectric transformer and, on the basis of the measurement of the operating parameter, to identify a load arranged in front of the output-side end face. As a result of the presence of the load in front of the output-side end face, the at least one operating parameter can be altered. The at least one operating parameter can be a phase between input current and input voltage, an impedance of the transformer or a resonant frequency of the transformer. The operating parameters mentioned here interact with one another. The operating parameters can be influenced and altered by a load arranged in front of the output-side end face. In this case, the load can alter an electric field generated by the transformer and thereby bring about a change in the operating parameters.

The drive electronics unit can be configured to apply an AC voltage to the input region of the transformer.

As a result of the positioning of a load in front of the output-side end face, the electric field strength of an electric field generated by the piezoelectric transformer can be concentrated on the corners of the output-side end face and the immediate surroundings thereof, with the result that plasma ignitions along the longitudinal edges of the output region can be avoided. If no load is arranged in front of the output-side end face, the electric field generated by the piezoelectric transformer is nondirectional and points in all spatial directions, wherein the field has considerable field components along the longitudinal edges of the output region as well. The load in front of the output-side end face provides for guiding the electric field, with the result that a maximum field strength is attained at the corners of the output-side end face.

The load can be formed by any arbitrary object. The load can be formed in particular by an object which is to be processed by the plasma generator. The load can be formed, for example, by a surface or an article provided for processing by means of plasma generated by the plasma generator. Alternatively, the load can also be formed by an object arranged permanently in the vicinity of the output-side end face, said object not being exposed to the plasma and likewise interacting with the electric field and providing for the desired guidance of the field. Such a load is also referred to as a passive load.

The load can be considered to be in front of the output-side end face of the piezoelectric transformer if the load is situated within a half-space spanned by means of the plane in which the output-side end face is situated, wherein the normal to the surface of the output-side end face facing away from the input region of the transformer points into the half-space. Furthermore, the load could be considered to be arranged in front of the output-side end face only if the distance between the output-side end face and the load is not greater than a maximum distance. In this case, the maximum distance can be chosen in such a way that the load can have a sufficient influence on an electric field generated by the piezoelectric transformer. The maximum distance can be, for example, 80 mm, preferably 40 mm.

The plasma generator can comprise a drive electronics unit configured to apply the AC voltage to the input region. The plasma generator can be configured, for example, so as only then to apply a power sufficient for igniting a non-thermal atmospheric-pressure plasma to the input region of the piezoelectric transformer by virtue of the drive electronics unit being configured to vary the AC voltage applied to the input region, depending on whether an object is arranged in front of the output-side end face. If an object is arranged in front of the output-side end face, then the drive electronics unit could apply to the input region an AC voltage that is high enough to trigger a plasma ignition in the output region.

By contrast, if no object is arranged in front of the output-side end face, then the drive electronics unit could either apply no AC voltage to the input region or apply an AC voltage that is too weak to trigger a plasma ignition in the output region.

If the load is a passive load arranged permanently in front of the output-side end face, a power sufficient for plasma ignition can always be able to be applied to the transformer.

The piezoelectric transformer can be the Rosen transformer described above. The transformer can be configured to the effect that an AC voltage can be applied to the input region. First and second internal electrodes and piezoelectric material can be stacked alternately one above another in the input region of the transformer. Furthermore, it is possible to arrange external electrodes in the input region on the outer surfaces of the transformer in such a way that the internal electrodes are electrically contacted with the first or the second external electrode alternately in the stacking direction.

The output region can comprise a piezoelectric material that causes an electric field to be established in the case of AC voltage applied to the input region. The output region can be free of internal electrodes. The output region can be a monolithic stack composed of piezoelectric material. The output region can consist of piezoelectric material that is polarized in the longitudinal direction.

The plasma generator can comprise a device for identifying an object arranged in front of the output-side end face of the piezoelectric transformer, wherein the object forms the load arranged in front of the output-side end face. The plasma generator can be configured in such a way that a power sufficient for generating the non-thermal atmospheric-pressure plasma is applied to the input region only if the device identifies an object arranged in front of the output-side end face.

In this way, ignitions of plasma can be prevented as long as no load is positioned in front of the output. The object identification can be carried out, for example, mechanically, optically or on the basis of an impedance or phase measurement at the piezoelectric transformer.

The device for identifying an object arranged in front of the output-side end face can comprise, for example, a mechanical probe element, which projects beyond the output-side end face in the longitudinal direction. The mechanical probe element can be configured in particular to identify touching of an object and to enable the plasma generation in this case. Such a mechanical probe element constitutes a simple and reliable system for object identification.

Furthermore, for a user of the plasma generator, the probe element can constitute an additional aid in orienting the plasma generator with respect to an object to be treated, since the probe element, by virtue of its length, for example, can indicate to the user an optimum operating distance between the plasma generator and the object.

The probe element can be arranged in such a way that the mechanical probe element is actuated by an object if the object is situated at an operating distance in front of the piezoelectric transformer. The actuation by the object can result in a mechanical resistance that is detected by the probe element.

The device for identifying an object arranged in front of the output-side end face can comprise a switch, which is configured to switch on and switch off the piezoelectric transformer and which is connected to the mechanical probe element in such a way that the switch switches on the piezoelectric transformer if the probe element identifies an object in front of the output-side end face.

Alternatively or additionally, the device for identifying an object arranged in front of the output-side end face can comprise an optical measuring device. The optical measuring device can be configured to emit an ultrasonic signal, to measure a reflection of the ultrasonic signal and to carry out a distance measurement on the basis of the measured reflection. Devices for optical distance measurement of this type allow a distance measurement with a high precision and can be supplemented in a simple manner as module in the plasma generator.

The plasma generator can comprise a drive electronics unit designed to apply an AC voltage to the input region of the piezoelectric transformer, wherein the device for identifying an object arranged in front of the output-side end face is formed by the drive electronics unit by virtue of the drive electronics unit being configured to measure a phase between the AC voltage applied to the input region and an AC current flowing via the piezoelectric transformer and, from the measured phase, to deduce the presence of an object in front of the output-side end face. If an object is present in front of the output-side end face, then it interacts as capacitive load and as load resistance with the piezoelectric transformer and thereby provides for a phase shift in the input region of the transformer. The drive electronics unit can be configured to identify such a phase shift and accordingly to deduce the presence of an object.

The drive electronics unit can be configured firstly to operate the piezoelectric transformer after the switch-on of the plasma generator in such a way that a power that is not sufficient for igniting a plasma is applied to the piezoelectric transformer and that, during operation of the piezoelectric transformer under no load, the phase between the AC voltage applied to the input region and the AC current lies in a defined range between $\alpha$ and $\beta$, wherein the drive electronics unit can further be configured to increase the power applied to the piezoelectric transformer if the phase deviates from the range between $\alpha$ and $\beta$ by a defined value. $\alpha$ and $\beta$ can be $-50°$ and $+5°$, for example. Preferably, a phase of $0°$ is chosen if the piezoelectric transformer is operated under no load.

"No load" here can denote a situation in which no load that could influence the profile of the electric field is arranged in direct proximity to the piezoelectric transformer. The piezoelectric transformer can be under no load if the piezoelectric transformer is so far away from an object to be treated by means of plasma that the object does not significantly influence an electric field generated by the transformer.

The load can be a passive load arranged permanently in front of the output-side end face. In this case, a load is referred to as a passive load if the load is not formed by an object to be treated. The load can be referred to as a passive load if no electrical voltage is applied to the load.

The passive load arranged permanently in front of the output-side end face can always influence an electric field generated by the transformer in such a way that the electric field strength is concentrated on the corners of the output-side end face. Plasma ignitions at the longitudinal edges can thus be ruled out.

The plasma generator can comprise a housing, in which the piezoelectric transformer is arranged. The housing can comprise a plasma exit opening, wherein plasma ignited by the piezoelectric transformer leaves the plasma generator via the plasma exit opening. The passive load can be arranged in direct proximity to the plasma exit opening.

The load can be ring-shaped, wherein the ring can have an internal diameter that is greater than the edge lengths of the output-side end face. Accordingly, the ring can enclose the output-side end face.

The passive load can comprise an insulating material, in particular aluminum oxide.

The plasma generator can comprise a housing composed of a first material, in which the piezoelectric transformer is arranged, wherein the passive load comprises a second material, wherein the relative permittivity of the second material is higher than the relative permittivity of the first material. Accordingly, the passive load can influence the field guiding of the electric field to a greater extent than the housing.

The passive load can consist of an electrically conductive material or a semiconducting material, wherein an insulating material is arranged between the load and the piezoelectric transformer. The insulating material can be the housing, for example. The insulating material ensures that there are no plasma discharges between the transformer and the passive load.

The output region of the piezoelectric transformer can be free of an insulation, for example, a shrink-on sleeve. On account of the above-described configuration of the plasma generator in which plasma is generated only if a load is arranged in front of the output-side end face of the transformer, it is possible to dispense with such an insulation in order to avoid undesired plasma ignitions along the longitudinal edges. Such an insulation would result in a damping of the oscillations of the piezoelectric transformer, as a result of which the efficiency would be reduced and the lifetime of the transformer would furthermore be reduced. In an alternative exemplary embodiment, such an insulation of the output region can additionally be provided as a further measure for avoiding undesired plasma ignitions.

The piezoelectric transformer can be configured to ignite the non-thermal atmospheric-pressure plasma at its output-side end face.

In accordance with a further aspect, a plasma generator for generating non-thermal atmospheric-pressure plasma is proposed, which plasma generator comprises a piezoelectric transformer, which is subdivided in the longitudinal direction into an input region and an output region, wherein the piezoelectric transformer comprises an output-side end face facing away from the input region, wherein the plasma generator comprises a passive load arranged permanently in front of the output-side end face.

Since the passive load is arranged permanently in front of the output-side end face, the power required for plasma ignition can always be applied to the transformer, since the load can permanently ensure that an electric field generated by the transformer is guided, in particular concentrated, by the load. A device for identifying a load, and a drive circuit configured to identify the presence of a load on the basis of measurements of at least one operating parameter, are not required in this embodiment. However, they can be present in alternative configurations.

The load can be ring-shaped and the ring can have an internal diameter that is greater than the edge lengths of the output-side end face. The passive load can comprise an insulating material, in particular aluminum oxide. The plasma generator can comprise a housing composed of a first material, in which the piezoelectric transformer is arranged, wherein the passive load comprises a second material, wherein the relative permittivity of the second material is higher than the relative permittivity of the first material. The passive load can consist of an electrically conductive material or a semiconducting material, wherein an insulating material is arranged between the load and the piezoelectric transformer. The piezoelectric transformer can be configured to ignite the non-thermal atmospheric-pressure plasma at its output-side end face.

Advantageous aspects are described below. In order to facilitate referencing, the aspects are numbered consecutively. Features of the aspects are relevant not only in combination with the specific aspect to which they relate, but also when considered separately.

Aspect 1: A plasma generator for generating non-thermal atmospheric-pressure plasma,
 comprising a piezoelectric transformer,
 which is subdivided in the longitudinal direction into an input region and an output region,
 wherein the piezoelectric transformer comprises an output-side end face facing away from the input region,
 wherein the plasma generator is configured in such a way that a power sufficient for igniting a non-thermal atmospheric-pressure plasma is applied to the input region of the piezoelectric transformer only if a load is arranged in front of the output-side end face.

Aspect 2: The plasma generator according to the preceding aspect,
 which comprises a device for identifying an object which is arranged in front of the output-side end face of the piezoelectric transformer and which forms a load arranged in front of the output-side end face, and
 wherein the plasma generator is configured in such a way that a power sufficient for generating the non-thermal atmospheric-pressure plasma is applied to the input region only if the device identifies an object arranged in front of the output-side end face.

Aspect 3: The plasma generator according to the preceding aspect,
 wherein the device for identifying an object arranged in front of the output-side end face comprises a mechanical probe element, which projects beyond the output-side end face in the longitudinal direction.

Aspect 4: The plasma generator according to the preceding aspect,
 wherein the mechanical probe element is arranged in such a way that the mechanical probe element is actuated by an object if the object is situated at an operating distance in front of the piezoelectric transformer.

Aspect 5: The plasma generator according to either of aspects 3 and 4,
 wherein the device for identifying an object arranged in front of the output-side end face comprises a switch, which is configured to switch on and switch off the piezoelectric transformer and which is connected to the mechanical probe element in such a way that the switch switches on the piezoelectric transformer only if the probe element identifies an object in front of the output-side end face.

Aspect 6: The plasma generator according to any of aspects 2 to 5,
 wherein the device for identifying an object arranged in front of the output-side end face comprises an optical measuring device.

Aspect 7: The plasma generator according to the preceding aspect,
 wherein the optical measuring device is configured to emit an ultrasonic signal, to measure a reflection of the ultrasonic signal and to carry out a distance measurement on the basis of the measured reflection.

Aspect 8: The plasma generator according to any of aspects 2 to 7,
   which comprises a drive electronics unit configured to apply the AC voltage to the input region of the piezoelectric transformer,
   wherein the device for identifying an object arranged in front of the output-side end face is formed by the drive electronics unit by virtue of the drive electronics unit being configured to measure a phase between the AC voltage applied to the input region and an AC current flowing via the piezoelectric transformer and, from the measured phase, to deduce the presence of an object in front of the output-side end face.

Aspect 9: The plasma generator according to aspect 8,
   wherein the drive electronics unit is configured firstly to operate the piezoelectric transformer after the switch-on of the plasma generator in such a way that a power that is not sufficient for igniting a plasma is applied to the piezoelectric transformer and that, during operation of the piezoelectric transformer under no load, the phase between the AC voltage applied to the input region and the AC current lies in a defined range between α and β, wherein the drive electronics unit is configured to increase the power applied to the piezoelectric transformer if the phase deviates from the range between α and β by a defined value.

Aspect 10: The plasma generator according to any of the preceding aspects,
   wherein the load is a passive load arranged permanently in front of the output-side end face.

Aspect 11: The plasma generator according to the preceding aspect,
   wherein the load is ring-shaped and the ring has an internal diameter that is greater than the edge lengths of the output-side end face.

Aspect 12: The plasma generator according to either of aspects 10 and 11,
   wherein the passive load comprises an insulating material, in particular aluminum oxide.

Aspect 13: The plasma generator according to any of aspects 10 to 12,
   wherein the plasma generator comprises a housing composed of a first material, in which the piezoelectric transformer is arranged, and wherein the passive load comprises a second material, wherein the relative permittivity of the second material is higher than the relative permittivity of the first material.

Aspect 14: The plasma generator according to either of aspects 10 and 11,
   wherein the passive load consists of an electrically conductive material or a semiconducting material and wherein an insulating material is arranged between the load and the piezoelectric transformer.

Aspect 15: The plasma generator according to any of the preceding aspects,
   wherein the output region of the piezoelectric transformer is free of an insulation.

BRIEF DESCRIPTION OF THE DRAWINGS

The present invention is described below with reference to the figures.

DETAILED DESCRIPTION OF ILLUSTRATIVE EMBODIMENTS

Figure 1:
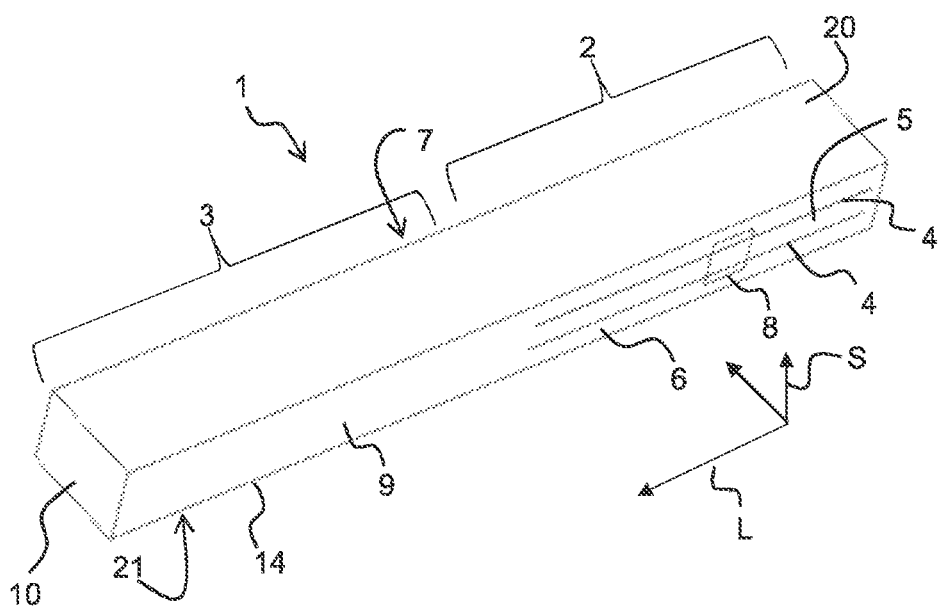
FIG. 1 shows a piezoelectric transformer in perspective view.

FIG. 1 shows a piezoelectric transformer 1 in a perspective view. The piezoelectric transformer 1 can be used in particular in a plasma generator for generating non-thermal atmospheric-pressure plasma.

A piezoelectric transformer 1 is a design of a resonance transformer, which is based on piezoelectricity and constitutes an electromechanical system in contrast to the conventional magnetic transformers. The piezoelectric transformer 1 is a Rosen-type transformer, for example.

The piezoelectric transformer 1 comprises an input region 2 and an output region 3, wherein the output region 3 is adjacent to the input region 2 in a longitudinal direction L. In the input region 2, the piezoelectric transformer 1 comprises electrodes 4, to which an AC voltage can be applied. The electrodes 4 extend in the longitudinal direction L of the piezoelectric transformer 1. The electrodes 4 are stacked alternately with a piezoelectric material 5 in a stacking direction S, which is perpendicular to the longitudinal direction L. In this case, the piezoelectric material 5 is polarized in the stacking direction S.

The electrodes 4 are arranged in the interior of the piezoelectric transformer 1 and are also referred to as internal electrodes. The piezoelectric transformer 1 comprises a first side surface 6 and a second side surface 7 opposite the first side surface 6. A first external electrode 8 is arranged on the first side surface 6. A second external electrode (not shown) is arranged on the second side surface 7. The internal electrodes 4 are electrically contacted alternately either with the first external electrode 8 or with the second external electrode in the stacking direction S.

Furthermore, the piezoelectric transformer 1 comprises a third side surface 20 and a fourth side surface 21, which are opposite one another and which are arranged perpendicular to the first side surface 6 and the second side surface 7. The surface normals relative to the third and fourth side surfaces 20, 21 each point in the stacking direction S.

The input region 2 can be driven with a low AC voltage applied between the electrodes 4. On account of the piezoelectric effect, the AC voltage applied on the input side is firstly converted into a mechanical oscillation. In this case, the frequency of the mechanical oscillation is essentially dependent on the geometry and the mechanical construction of the piezoelectric transformer 1.

The output region 3 comprises piezoelectric material 9 and is free of internal electrodes. The piezoelectric material 9 in the output region 3 is polarized in the longitudinal direction L. The piezoelectric material 9 of the output region 3 can be the same material as the piezoelectric material 5 of the input region 2, wherein the piezoelectric materials 5 and 9 can differ in their polarization direction. In the output region 3, the piezoelectric material 9 is shaped to form a single monolithic layer, which is polarized completely in the longitudinal direction L. In this case, the piezoelectric material 9 in the output region 3 has only a single polarization direction.

If an AC voltage is applied to the electrodes 4 in the input region 2, then a mechanical wave forms within the piezoelectric material 5, 9, said mechanical wave generating an output voltage as a result of the piezoelectric effect in the output region 3. The output region 3 has an output-side end face 10. In the output region 3, an electrical voltage is thus generated between the end face 10 and the end of the electrodes 4 of the input region 2. In this case, a high voltage is generated at the output-side end face 10. In this case, a high potential difference also arises between the output-side end face and surroundings of the piezoelectric transformer, said potential difference being sufficient to generate a strong electric field that ionizes a process gas.

In this way, the piezoelectric transformer 1 generates high electric fields that are able to ionize gases or liquids by means of electrical excitation. In this case, atoms or molecules of the respective gas or respective liquid are ionized and form a plasma. An ionization occurs whenever the electric field strength at the surface of the piezoelectric transformer 1 exceeds the ignition field strength of the plasma. In this case, ignition field strength of a plasma denotes the field strength required for ionizing the atoms or molecules.

The plasma generator furthermore comprises a drive electronics unit 11. The drive electronics unit 11 is configured to apply an AC voltage to the input region 2 of the piezoelectric transformer 1.

The plasma generator furthermore comprises a housing 12. The piezoelectric transformer 1 and the drive electronics unit 11 are arranged in the housing 12. The housing 12 is tubular. The housing 12 comprises an electrically insulating material. The housing 12 comprises a plasma exit opening 13. The piezoelectric transformer 1 is arranged in the housing 12 in such a way that the output-side end face 10 is situated in the vicinity of the plasma exit opening 13.

The electric field generated in the output region 3 of the piezoelectric transformer 1 is nondirectional when the piezoelectric transformer 1 is under no load, and accordingly points in all spatial directions. As a result of a load being arranged in front of the output-side end face 10, the electric field generated by the piezoelectric transformer 1 can be guided. In this case, the field is guided in particular toward the load. As a result, the field components along the longitudinal edges 14 are weakened. Accordingly, the undesired plasma ignitions along the longitudinal edges 14 do not occur in this case.

Figure 2:
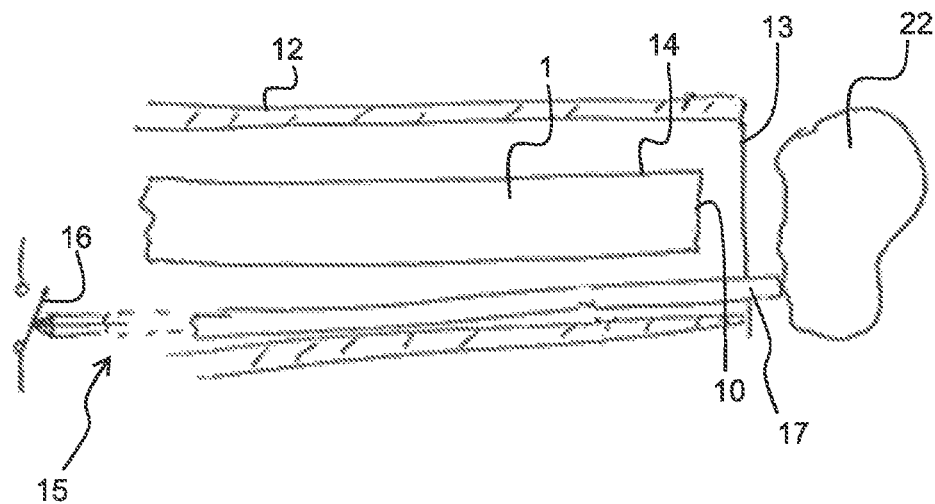
FIG. 2 shows a plasma generator in accordance with a first exemplary embodiment.

FIG. 2 shows a first exemplary embodiment of a plasma generator configured to avoid undesired plasma ignitions at the longitudinal edges 14 in the output region 3 of the piezoelectric transformer 1. For this purpose, the plasma generator is configured in such a way that an ignition of a non-thermal atmospheric-pressure plasma is possible only if a load is arranged in front of the output-side end face 10 of the piezoelectric transformer 1. Said load can be formed, for example, by a surface to be treated or an article to be treated. The load arranged in front of the output-side end face 10 provides for the electric field to be guided, whereby it can be ensured that plasma is emitted only in the direction of the load.

The plasma generator shown in FIG. 2 comprises a device 15 for identifying an object 22 arranged in front of the output-side end face of the piezoelectric transformer 1. The object identification is effected mechanically in this exemplary embodiment. For this purpose, the device 15 comprises a switch 16 and a mechanical probe element 17.

The mechanical probe element 17 projects beyond the output-side end face 10 of the transformer 1 by an operating distance. The mechanical probe element 17 is configured to identify whether an object 22 is situated at the position at which a tip of the mechanical probe element 17 is arranged, said tip facing away from the piezoelectric transformer 1. If an object 22 is situated there, then the tip strikes the object 22 and the mechanical probe element 17 experiences a mechanical resistance. The operating distance is chosen such that it accords with the ideal distance between the piezoelectric transformer 1 and a surface to be processed. The operating distance can be between 1 mm and 40 cm, for example.

The switch 16 can adopt an open state and a closed state. If the mechanical probe element 17 does not experience a mechanical resistance, the switch 16 is in its open state. If the mechanical probe element 17 experiences a mechanical resistance, since it strikes an object 22, for example, the switch 16 is put into its closed state.

If the switch 16 is open, then the switch 16 interrupts an electrical connection between the drive electronics unit 11 and the piezoelectric transformer 1, such that no voltage is applied to the input region 2 of the piezoelectric transformer 1. If the switch 16 is closed, the drive electronics unit 11 is electrically connected to the piezoelectric transformer 1 and a voltage can be applied to the transformer 1. Accordingly, plasma can be generated only with the switch 16 closed. The switch 16 is closed if the mechanical probe element 17 identifies an object 22 arranged in front of the output-side end face 10, said object acting as an electrical load.

The plasma generator in accordance with the first exemplary embodiment is accordingly designed in such a way that a plasma ignition is possible only if an object 22 is situated at the defined operating distance with respect to the output-side end face 10. It is only in this case that the mechanical probe element 17 is actuated by the object 22 and thereupon enables the plasma ignition. In this way, it can be ensured that the plasma generator is always arranged at the ideal operating distance with respect to an object 22 to be processed.

As an alternative or in addition to the device 15 shown here for identifying an object arranged in front of the output-side end face 10, said device comprising the switch 16 and the mechanical probe element 17, an optical distance measurement can also be carried out. In this case, the device 15 can comprise an optical measuring device (not shown) configured to emit an ultrasonic signal, to measure the reflection thereof and to carry out a distance measurement on the basis of the measured reflection. In this way, it is possible to identify whether an object to be treated is arranged directly in front of the output-side end face 10 of the piezoelectric transformer 1. Corresponding optical measuring devices can carry out these measurements with high accuracy.

The plasma generator is configured in such a way that a plasma ignition is made possible only if the optical distance measurement reveals that an object is arranged sufficiently close in front of the output-side end face 10 of the transformer 1. In particular, it is possible to define a threshold value for a minimum distance. A plasma ignition can be made possible only if the optical distance measurement reveals that an object is situated at a distance from the output-side end face 10 which is less than the defined minimum distance.

By contrast, if the optical distance measurement reveals that no object is arranged sufficiently close in front of the output-side end face 10, the drive electronics unit 11 can be programmed such that no voltage is applied to the input region 2 of the transformer 1.

Figure 3:
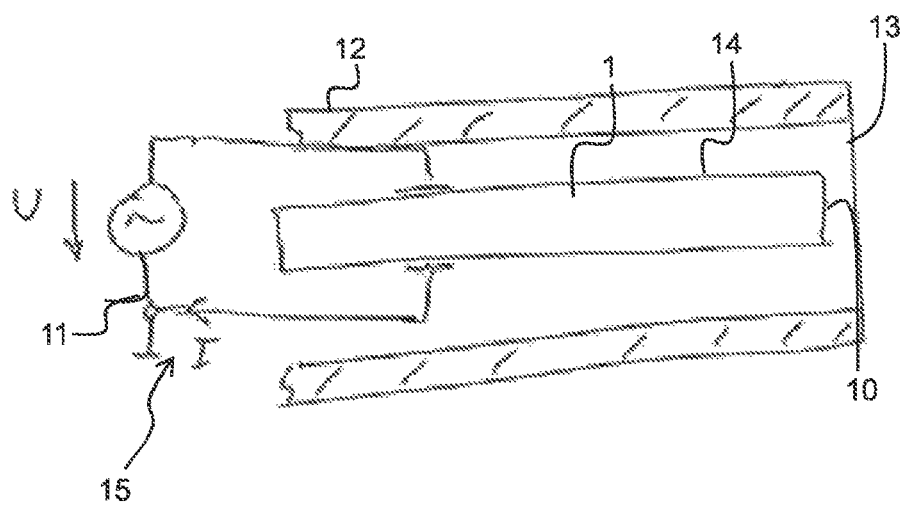
FIG. 3 shows a plasma generator in accordance with a second exemplary embodiment.

FIG. 3 shows a plasma generator in accordance with a second exemplary embodiment. In accordance with the second exemplary embodiment, the drive electronics unit 11 of the plasma generator, said drive electronics unit being configured to apply an AC voltage to the input region 2 of the piezoelectric transformer 1, forms the device 15 for identifying an object arranged in front of the output-side end face 10. The drive electronics unit 11 is indicated schematically in FIG. 3.

If the plasma generator is switched on, then the drive electronics unit 11 firstly applies a low power to the piezoelectric transformer 1, said power being chosen such that it does not suffice to trigger a plasma ignition in the output region 3. The power applied to the transformer 1 by the drive electronics unit 11 is furthermore chosen such that during operation of the piezoelectric transformer 1 under no load, a phase between the applied AC voltage and an associated AC current is between −5° and +5°, preferably 0°. The drive electronics unit 11 is configured to constantly monitor this phase. If the plasma generator is then brought close to an object to be treated, the object acts on the piezoelectric transformer 1 as an output-side capacitance and as a load resistance. This results in a shift in the phase between the AC current and the AC voltage. The drive electronics unit 11 identifies this phase shift. If the phase shift exceeds a predefined threshold value, then the drive electronics unit 11 interprets this as evidence of the object arranged in front of the output-side end face 10. If an object to be treated is identified in this way, the drive electronics unit 11 increases the power applied to the piezoelectric transformer 1, with the result that a non-thermal atmospheric-pressure plasma is then ignited on the output-side end face 10.

If the piezoelectric transformer 1 is moved away again from the article to be treated, then this once again leads to a phase shift. The drive electronics unit 11 is configured to identify such a phase shift and thereupon to reduce the power applied to the piezoelectric transformer 1, with the result that plasma ignitions no longer occur. In this way, the transformer 1 is protected against the ignition of plasma under no load.

In the exemplary embodiments described above, therefore, a plasma is generated only when an object is present in front of the output-side end face 10 of the transformer 1, wherein the object must be sufficiently close to the output-side end face 10. In this case, the object provides for field guidance of the plasma, which ensures that plasma ignitions at the longitudinal edges 14 are avoided.

Figure 4:
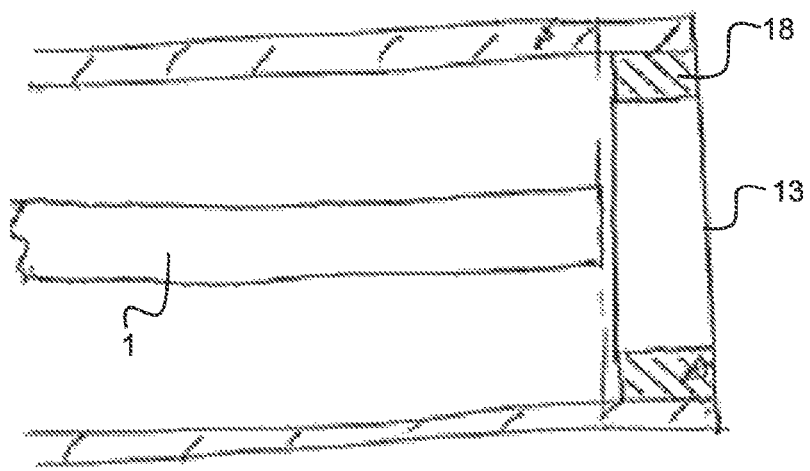
FIG. 4 shows a plasma generator in accordance with a third exemplary embodiment.

FIG. 4 illustrates a third exemplary embodiment of the plasma generator. The plasma generator comprises a passive load 18 arranged permanently in front of the output-side end face 10 of the piezoelectric transformer 1. The plasma generator in accordance with the third exemplary embodiment can always be used for igniting a non-thermal atmospheric-pressure plasma, without the occurrence of undesired plasma ignitions along the edges 14. An object to be treated which acts as a load need not necessarily be arranged in front of the output-side end face 10. Rather, the passive load 18 likewise acts to provide field guidance.

The passive load 18 can be a ring-shaped element, for example. The passive load 18 is arranged at an inner side of the tubular housing 12. The passive load 18 is arranged at the plasma exit opening 13 of the housing. The passive load 18 consists of a material whose relative permittivity is higher than the relative permittivity of the material of the housing 12. The passive load 18 can consist of aluminum oxide, for example.

On account of its electrical properties, the passive load 18 ensures that the electric field generated by the piezoelectric transformer 1 is concentrated on the corners of the output-side end faces 10. If an active load, for example, an object to be treated, is then held in front of the passive load 18, the active load would in turn concentrate the field strength better than the passive load 18, such that the plasma would be fed mainly to the active load and power losses do not occur as a result of the passive load 18.

Figure 5:
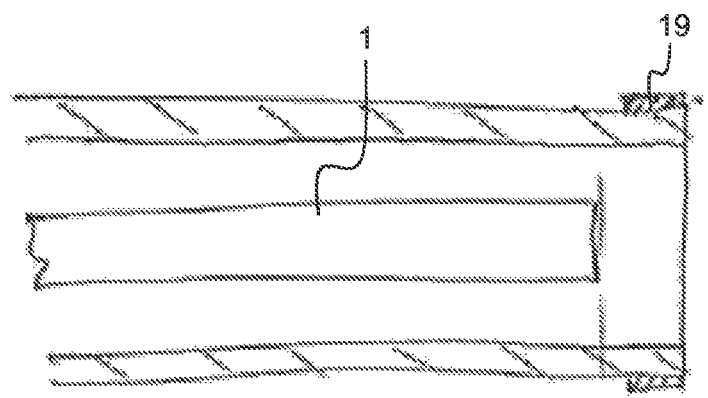
FIG. 5 shows a plasma generator in accordance with a fourth exemplary embodiment.

FIG. 5 shows a fourth exemplary embodiment, wherein, instead of a passive load 18 composed of an insulating material, a passive load 19 comprising an electrically conductive material or a semiconducting material is used for field guidance. The passive load 19 is better suited to field guidance than a passive load 18 composed of an insulating material. The passive load 19 is arranged on an outer side of the tubular housing 12 and encloses the plasma exit opening 13 of the housing 12. Since the housing 12 consists of an insulating material arranged between the passive load 19 and the piezoelectric transformer 1, the housing 12 can ensure that a direct plasma ignition between the transformer 1 and the passive load 19 does not occur.

The passive load 19 comprising a conducting or semiconducting material also acts substantially like the passive load 18 described in the third exemplary embodiment. The load 19 has the effect that the electric field generated by the transformer 1 is concentrated on the output-side end face 10 of the transformer 1, that the field is guided and that plasma ignitions along the output-side longitudinal edges 14 are avoided in this way.

On account of the measures outlined in the exemplary embodiments, it is ensured that a plasma ignition occurs only if a load is arranged in front of the output-side end face 10. For this reason, the insulation of the output region 3 can be dispensed with in all of the exemplary embodiments. Otherwise, such an insulation, for example, by means of a shrink-on sleeve, would be necessary in order to avoid plasma ignitions along the longitudinal edges.

The exemplary embodiments described here are combinable with one another. By way of example, the piezoelectric transformer 1 can comprise both a passive load 18, 19 in accordance with the third or fourth exemplary embodiment and a device 15 for identifying an object arranged in front of the output-side end face 10 in accordance with the first or second exemplary embodiment. Plasma generation can be made possible only if the device 15 identifies such an object. In this case, the passive load 18, 19 can contribute to further improved field guidance by virtue of the passive load 18, 19 further concentrating the electric field generated by the piezoelectric transformer 1.

The invention claimed is:

1. A plasma generator comprising:
   a piezoelectric transformer subdivided into an input region and an output region in a longitudinal direction, wherein the piezoelectric transformer comprises an output-side end face facing away from the input region; and
   a drive electronics unit configured to:
      measure at least one operating parameter of the piezoelectric transformer; and
      identify, on basis of the measurement of the operating parameter, a load arranged in front of the output-side end face
   wherein the plasma generator is configured in such a way that a power sufficient for igniting a non-thermal atmospheric-pressure plasma is able to be applied to the input region of the piezoelectric transformer only when a load is arranged in front of the output-side end face.

2. The plasma generator according to claim 1, wherein the at least one operating parameter is a phase between an AC voltage applied to the input region and an AC current flowing via the piezoelectric transformer.

3. The plasma generator according to claim 2, wherein the drive electronics unit is configured to:
operate the piezoelectric transformer, after switch-on, such that a power that is not sufficient for igniting the plasma is applied to the piezoelectric transformer and that, during operation of the piezoelectric transformer under no load, the phase between the AC voltage applied to the input region and the AC current lies in a defined range between α and β; and
increase the power applied to the piezoelectric transformer when the phase deviates from the range between α and β by a defined value.

4. The plasma generator according to claim 1,
wherein the at least one operating parameter is an impedance of the piezoelectric transformer, or
wherein the at least one operating parameter is a resonant frequency of the piezoelectric transformer.

5. The plasma generator according to claim 1, further comprising:
an identifying device configured to identify an object which is arranged in front of the output-side end face of the piezoelectric transformer and which forms a load arranged in front of the output-side end face,
wherein the plasma generator is configured to apply a power sufficient for generating the plasma to the input region only when the identifying device identifies an object arranged in front of the output-side end face.

6. The plasma generator according to claim 5, wherein the identifying device comprises a mechanical probe element, which projects beyond the output-side end face in the longitudinal direction.

7. The plasma generator according to claim 6, wherein the mechanical probe element is arranged in such a way that the mechanical probe element is actuated by an object if the object is situated at an operating distance in front of the piezoelectric transformer.

8. The plasma generator according to claim 6, wherein the identifying device comprises a switch, wherein the switch is configured to switch on and switch off the piezoelectric transformer, and wherein the switch is connected to the mechanical probe element such that the switch switches on the piezoelectric transformer only when the mechanical probe element identifies an object in front of the output-side end face.

9. The plasma generator according to claim 5, wherein the identifying device comprises an optical measuring device.

10. The plasma generator according to claim 9, wherein the optical measuring device is configured to:
emit an ultrasonic signal;
measure a reflection of the ultrasonic signal; and
carry out a distance measurement on basis of the measured reflection.

11. The plasma generator according to claim 1, wherein the load is a passive load arranged permanently in front of the output-side end face.

12. The plasma generator according to claim 11, wherein the load is ring-shaped and the ring-shaped load has an internal diameter that is greater than edge lengths of the output-side end face.

13. The plasma generator according to claim 11, wherein the passive load comprises an insulating material.

14. The plasma generator according to claim 11, further comprising a housing composed of a first material, in which the piezoelectric transformer is arranged, wherein the passive load comprises a second material, and wherein a relative permittivity of the second material is higher than a relative permittivity of the first material.

15. The plasma generator according to claim 11, wherein the passive load consists essentially of an electrically conductive material or a semiconducting material, and wherein an insulating material is arranged between the load and the piezoelectric transformer.

16. The plasma generator according to claim 1, wherein the output region of the piezoelectric transformer is free of an insulation material.

17. The plasma generator according to claim 1, wherein the piezoelectric transformer is configured to ignite the plasma at its output-side end face.

18. A plasma generator comprising:
a piezoelectric transformer subdivided into an input region and an output region in a longitudinal direction,
wherein the piezoelectric transformer comprises an output-side end face facing away from the input region,
wherein the plasma generator comprises a passive load arranged permanently in front of the output-side end face,
wherein the plasma generator is configured to generate non-thermal atmospheric-pressure plasma, and
wherein the plasma generator is configured such that a power sufficient for igniting the non-thermal atmospheric-pressure plasma is able to be applied to the input region of the piezoelectric transformer.

19. The plasma generator according to claim 18, wherein the load is ring-shaped and the ring-shaped load has an internal diameter that is greater than edge lengths of the output-side end face.

20. The plasma generator according to claim 18, wherein the passive load comprises an insulating material.

21. The plasma generator according to claim 18, further comprising a housing composed of a first material, in which the piezoelectric transformer is arranged, wherein the passive load comprises a second material, and wherein a relative permittivity of the second material is higher than a relative permittivity of the first material.

22. The plasma generator according to claim 18, wherein the passive load consists essentially of an electrically conductive material or a semiconducting material, and wherein an insulating material is arranged between the load and the piezoelectric transformer.

23. The plasma generator according to claim 18, wherein the piezoelectric transformer is configured to ignite the non-thermal atmospheric-pressure plasma at its output-side end face.

24. A plasma generator comprising:
a piezoelectric transformer subdivided into an input region and an output region in a longitudinal direction,
wherein the piezoelectric transformer comprises an output-side end face facing away from the input region,
wherein the plasma generator comprises a passive load arranged permanently in front of the output-side end face, and
wherein the plasma generator is configured to generate non-thermal atmospheric-pressure plasma; and
a housing composed of a first material, in which the piezoelectric transformer is arranged,
wherein the passive load comprises a second material, and
wherein a relative permittivity of the second material is higher than a relative permittivity of the first material.

* * * * *